United States Patent [19]

Piwcyzk

[11] 4,022,928
[45] May 10, 1977

[54] VACUUM DEPOSITION METHODS AND MASKING STRUCTURE

[76] Inventor: Bernhard P. Piwcyzk, No. 6 Lismer Court, Kanata, Ontario, Canada, K2K 1A2

[22] Filed: May 10, 1976

[21] Appl. No.: 684,563

Related U.S. Application Data

[63] Continuation-in-part of Ser. No. 580,023, May 22, 1975, abandoned.

[52] U.S. Cl. .................... 427/43; 427/53; 427/154; 427/248 J; 427/259; 427/264
[51] Int. Cl.² .......................... B05D 3/06
[58] Field of Search .......... 106/2; 260/2 A; 427/43, 427/53, 154, 259, 264, 270, 271, 282, 99, 248 R, 248 H, 248 I, 248 J

[56] References Cited

UNITED STATES PATENTS

| | | | |
|---|---|---|---|
| 2,002,848 | 5/1935 | Cohen | 427/259 |
| 2,559,389 | 7/1951 | Beeber | 156/659 |
| 2,883,257 | 4/1959 | Wehe | 346/158 |
| 2,970,064 | 1/1961 | Bolton | 427/99 |
| 3,139,352 | 6/1964 | Coyner | 427/259 |
| 3,202,543 | 8/1965 | Thun | 427/99 |
| 3,378,401 | 4/1968 | Kaspaul et al. | 427/43 |
| 3,503,796 | 3/1970 | Maddison | 427/444 |
| 3,677,793 | 7/1972 | Blosch | 427/250 |
| 3,692,574 | 9/1972 | Kobayashi | 427/86 |
| 3,705,060 | 12/1972 | Stork | 156/643 |
| 3,799,792 | 3/1974 | Ryng | 427/248 |
| 3,847,978 | 11/1974 | Sianesi et al. | 260/535 |

FOREIGN PATENTS OR APPLICATIONS 1,120,989  7/1968  United Kingdom ............... 427/259

Primary Examiner—John H. Newsome
Attorney, Agent, or Firm—Flehr, Hohbach, Test

[57] ABSTRACT

A coating of a perfluoropolyether compound is applied to surfaces for inhibiting the deposition of a source material by evaporating or sputtering within a vacuum, and for the deposition of such material onto irregular surfaces, voids, or holes of an object. The coating can be applied by evaporating and then condensing the compound within a vacuum, or it can be applied as a fluid or thixotropic paste through direct contact by means such as a printing process. The coating can further be applied by spraying, or by spinning the surfaces about an axis with the fluid forming a thin coating through the action of centrifugal force. Selected portions of the coating can be removed so that the material is deposited in predetermined patterns. One method of removal is by dissolving the compound in a solvent. The coating can also be removed by selective evaporation in which a laser beam or an electron beam is directed across the surface. The beam evaporates the coating along a predetermined path whereby source material is subsequently condensed onto the substrate along this path. The vapor stream of material is reflected from surfaces coated with the compound so as to deposit onto surface portions of the object which are not in a line of sight with the source.

48 Claims, 12 Drawing Figures

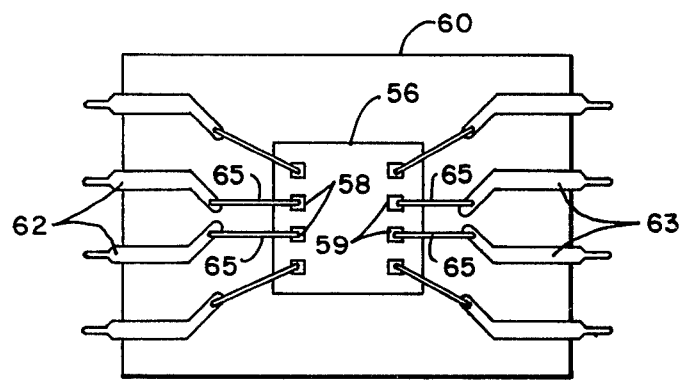
FIG.—8
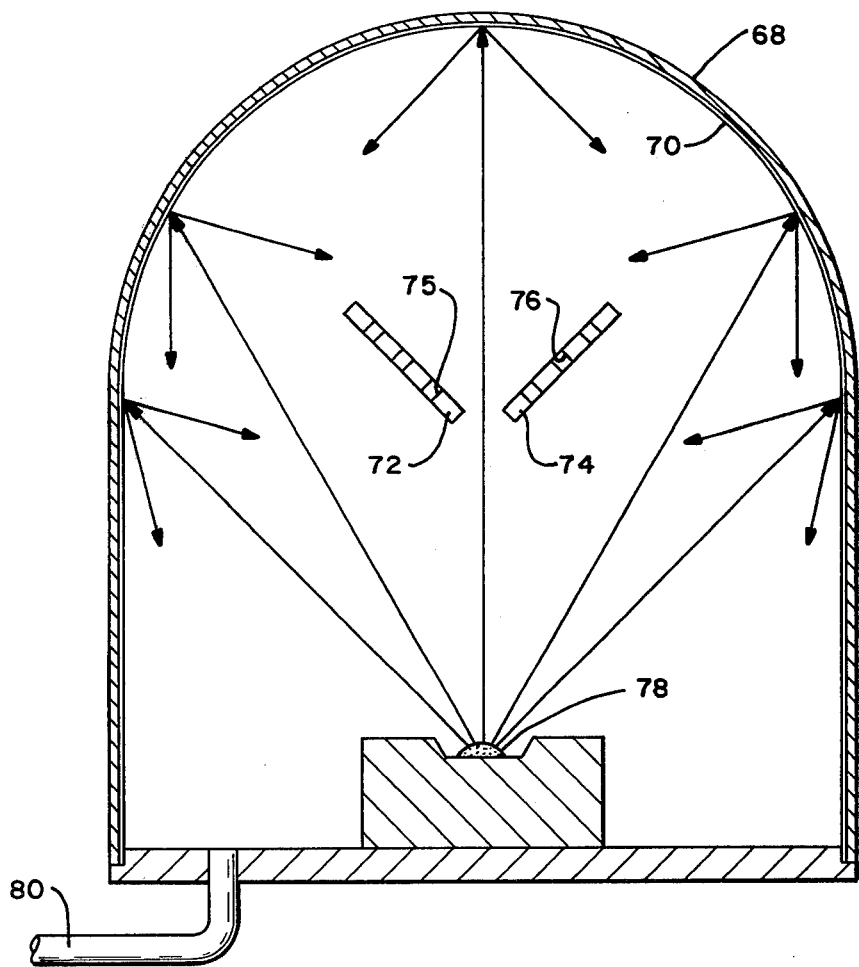
FIG.—9

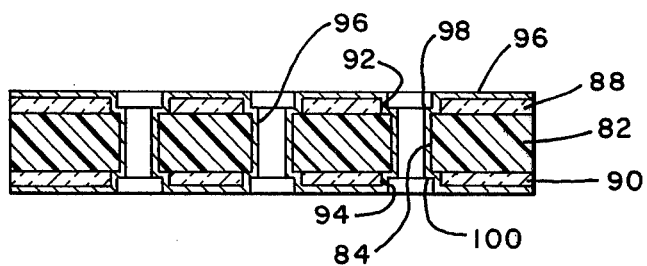
FIG.—10
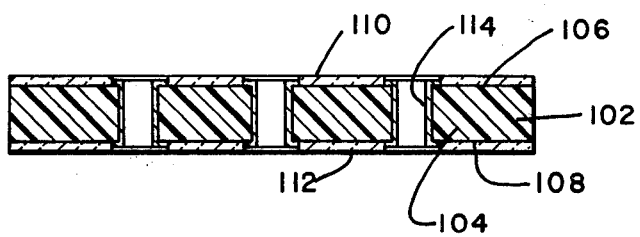
FIG.—11
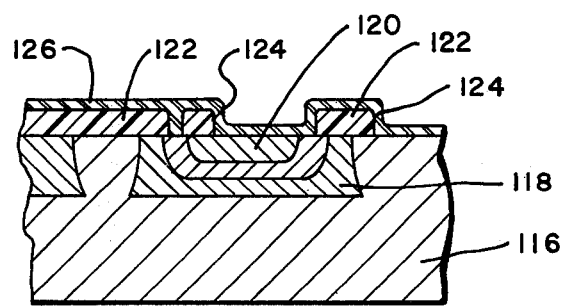
FIG.—12

VACUUM DEPOSITION METHODS AND MASKING STRUCTURE

CROSS REFERENCE TO RELATED APPLICATION

This is a continuation-in-part of application Ser. No. 580,023 filed May 22, 1975 now abandoned.

BACKGROUND OF THE INVENTION

This invention relates in general to vacuum deposition technology. More particularly, the invention relates to inhibiting the deposition of materials onto surfaces within a vacuum.

Vacuum deposition of materials is used in processes such as the formation of electrical devices (e.g., thin film resistors and capacitors), semiconductor devices (e.g., integrated circuits), optical interference film, reflective surfaces and the manufacture of devices with decorative or utilitarian metal patterns. Typically these processes are carried out by heating the source material within a vacuum chamber or bell jar so that a vapor stream of the material is created which subsequently condenses on surfaces within the chamber. Another method which has been employed to form thin films is by the cathode sputtering of a material within a vacuum chamber.

In conventional procedures of the foregoing nature, there are problems in controlling deposition of the material onto the various surfaces within the chamber. Heretofore the selective coating of surfaces by vacuum deposition has been difficult or impossible due to the susceptability of the substrate material and thin films present on the substrate to etchants or other thin film removing and masking techniques.

L. Holland describes at page 260 of his book *Vacuum Deposition of Thin Films* that zinc vapor will not condense on a greasy surface, such as a surface coated with a film of wax or with a silicone diffusion pump oil. The book describes the use of the coatings to provide unmetallized bands and to keep observation windows clear from zinc deposits. However, such coatings are unsatisfactory in view of the difficulty in applying the coatings and in forming patterns of the coating, the contaminating nature of the fluids for many deposition applications, the poor deposition inhibiting properties for many materials, and the inability to form extremely thin films and patterns with good linewidth resolutions.

Upon completion of vacuum deposition, it has heretofore been necessary to clean residual condensed material from the inside surfaces of the chamber. Where masks are used in the path of the vapor stream for depositing material in patterns, it has also been necessary to clean condensed material from the masks themselves. Furthermore, the inside surfaces of the viewing windows or sightglass within a vacuum chamber become obscured or fogged during vacuum deposition, making it difficult to observe the deposition processes. These viewing surfaces must also be cleaned periodically.

Conventional vacuum deposition techniques for fabricating electrical devices such as resistors and capacitors are carried out by film deposition through masks. Vacuum deposition is used to fabricate electronic devices such as semiconductors and integrated circuits by means of photolithography and etching. The photo-etching techniques employ the formation of etchant-resist patterns photographically. In multiple layer work such as for integrated circuits, the formation of each layer of deposited material requires separate application of a photoresist coating followed by photoexposure of the desired pattern image, development and post-baking, chemical etching of the thin film pattern, and removal of the photoresist mask. Such techniques are relatively expensive, time consuming and have a high labor content. It would be desirable to provide a simplified method by which the various layered patterns are formed on a substrate without the requirement of using the photographic etchant-resist process.

Heretofore it has been difficult or impossible to vacuum deposit materials onto irregular or blind surfaces which are not in a line of sight with the source, such as cavities, channels, holes or the reverse side of a target object. Methods which have been employed in an attempt to overcome these problems are the use of multiple evaporation sources arrayed about the object, or the use of a planetary system to rotate the object during the evaporation process. In many cases these methods have not been satisfactory. Reasonably uniform coatings on irregular surfaces such as insects have in the past been applied using complex mechanical movements to change the angle of incidence of the vapor streams. However, it has been difficult to form uniform coatings on biological specimens which are to be examined by scanning electron microscopes. A further problem is in forming a uniform film over a semiconductor having stepped layers, such as along the edges formed in oxide layers by etching.

OBJECTS AND SUMMARY OF THE INVENTION

It is a general object of the invention to provide a new method for inhibiting the deposition of materials onto surfaces within a vacuum. The method makes use of an inhibitor compound which is coated onto the surfaces upon which deposition is to be prevented.

Another object is to provide a masking structure for use in forming a body which includes a material which is condensed in a selected pattern from a vapor stream within a vacuum.

Another object is to provide a method and masking structure for use in vacuum deposition processes to form electrical devices such as thin film resistors and capacitors, to form electronic devices such as semiconductor devices and integrated circuits, to form electronic device interconnection systems as well as device packages, to form photoelectric devices, and to form optical devices requiring thin film deposition in selected areas.

Another object is to provide a vacuum deposition method for reflecting a vapor stream for deposit onto irregular or blind surfaces, cavities, channels, holes or the reverse side of an object such as through holes in a substrate, etched semiconductor layers, or biological specimens and the like.

Another object is to provide a method and masking structure of the type described for the vacuum deposition of decorative or utilitarian patterns of material onto surfaces, e.g., forming labels for products.

Another object is to provide a method of the type described in which the inhibitor fluid is coated onto the surfaces by means of direct contact such as by printing, by means of spin coating, by means of spraying, or by means of evaporation and subsequent deposition.

Another object is to provide a method of the type described in which the thickness of the coating of inhibitor fluid on the surfaces is controlled by the following variables: evaporating the fluid at a predetermined rate, varying the distance and/or orientation of the substrate with respect to the vapor source, limiting the quantity of source inhibitor fluid, varying the time allowed for vapor deposition.

Another object is to provide a method and masking structure of the type described in which the inhibitor fluid is noncontaminating in a vacuum deposition process.

Another object is to provide a method of fabricating a masking structure of the type described in which the mask pattern is defined by removing predetermined areas of the fluid by rinsing with a solvent, or by evaporation. The fluid is evaporated by controlling the movement of a projected energy source, such as a laser beam or an electron beam, across the surface. Pattern linewidths of very small dimensions can be readily formed by the laser or electron beam procedures.

Another object is to provide a method of the type described in which surfaces within a vacuum chamber, such as the inner surfaces of a bell jar or sightglass, are coated with the fluid for preventing subsequent deposition of the evaporatable material.

A further object is to provide a vacuum deposition method which results in a savings in the amount of evaporant material, e.g. precious metals, being deposited. The evaporant condenses only on the desired target surfaces, i.e. those not coated by the inhibitor fluid, so that less evaporant is required in comparison to conventional vacuum deposition procedures.

The invention in summary includes a method in which a coating of perfluoropolyether compound is applied to the surfaces upon which deposition of an evaporatable material is to be inhibited. The compound can be applied by a printing process as a fluid or thixotropic paste to coat selected areas of the surface, by spraying, by spin coating, or by evaporating the fluid under a vacuum within a chamber. Sponge metal pellets in which the fluid compound is absorbed can be placed into the chamber to provide the source for the evaporation process. With the coating applied, a vacuum is established and the source material, such as a metal or carbon, is evaporated to create a vapor stream which is deposited upon uncoated surfaces but which is inhibited from depositing upon the coated surfaces. The fluid coating can be removed from selected areas to form a masking structure for depositing the source material in patterns. One method of removal is by rinsing the fluid from the selected areas with a solvent. Another removal method is by evaporating the fluid along a predetermined path by means such as controlling the movement of laser or electron beams across the surface.

The method of depositing the source material onto irregular surfaces, cavities, channels, holes and the reverse sides of an object includes forming a coating of perfluoropolyether compound onto a surface such as the inner wall of a vacuum chamber or bell jar within which the object is placed. Portions of the vapor stream from the source are reflected from the coated surfaces so as to deposit upon surfaces of the object which are not in line of sight with the source.

The foregoing and additional objects and features of the invention will become apparent from the following description in which the preferred embodiments have been set forth in detail in conjunction with the accompanying drawings.

BRIEF DESCRIPTION OF THE DRAWINGS

FIG. 8 is a plan view of an integrated circuit chip interconnected with the terminals of a lead frame by a method of the invention.

FIG. 9 is a schematic elevational view of a vacuum chamber illustrating the method of reflecting a vapor stream for depositing material onto surface portions not in line of sight with the source.

FIG. 10 is a fragmentary cross sectional view of a substrate and mechanical mask in which material is deposited in through holes by the method of FIG. 9.

FIG. 11 is a fragmentary cross sectional view of a substrate and masking structure formed by the method of FIGS. 3-7 for use in depositing the material in through holes of the substrate by the method of FIG. 9.

FIG. 12 is a fragmentary cross sectional view of a semiconductor device fabricated with the method of FIG. 9.

DESCRIPTION OF THE PREFERRED EMBODIMENTS

A. Inhibitor Fluids

Figure 1:
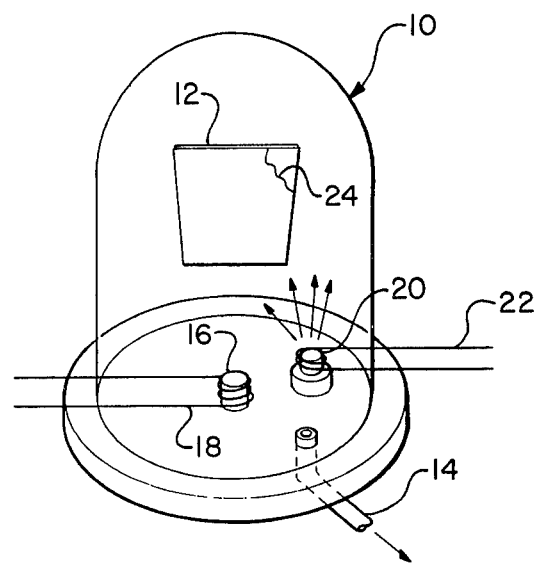
FIG. 1 is a schematic elevational view of a vacuum chamber in which a method of the invention is carried out.

The invention employs organic compounds which I have found to have the surprising and unexpected properties of being highly effective in inhibiting the condensation or deposition of a wide range of materials onto surfaces in vacua. These compounds are referred to herein as inhibitor fluids.

The organic compounds used as inhibitor fluids in this invention are the class of perfluoropolyethers having the following general formula:

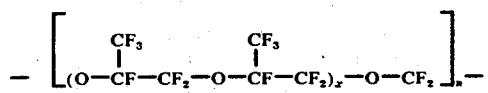

where $x$ is an integer in the range of 1 to 25 and $n$ is an integer in the range of 1 to 25. When synthesized the crude product comprises a range of molecular weights.

The crude product is fractionally distilled into perfluoropolyether cuts or species characterized in having different average molecular weights (AMU), vapor pressures and viscosity indices.

The perfluoropolyether species which are employed in the invention as inhibitor fluids are the compounds sold under the trademarks Fomblin YR, Fomblin YU, Fomblin Y25, Fomblin Y16, Fomblin Y06, Fomblin Y04 and Fomblin Y02 by the Montecatini-Edison Company, and the trademark Krytox by the DuPont Company. Such compounds are conventionally used for purposes such as lubricants, e.g. for pumps, valves and compressors, as base stock for greases, as release agents for the molding of plastomers and elastomers, as dielectric fluids, as inert fluids for heat transfer, and as diffusion pump oils.

The selection of the particular species of inhibitor fluid is dependent upon the desired application, such as the vacuum level at which the deposition process takes place. The selected inhibitor fluid should have a vapor pressure at room temperature, i.e., 25° C, at least below the vacuum level at which the vapor source material is being deposited.

It is understood that some of the properties of the different species of inhibitor fluids are as set forth in Table I.

TABLE I

| Fluid | AMU | Vapor Pressure (at 300° F) | Vapor Pressure (at 25° C) | Kinematic Viscosity (cs at 100° F) |
|---|---|---|---|---|
| Fomblin YR | 6,700 | $5 \times 10^{-4}$ Torr | $5 \times 10^{-6}$ Torr | 516 |
| Fomblin YU | 4,300 | About 6 Torr | About $4.6 \times 10^{-2}$ Torr | 162 |
| Fomblin Y25 | 3,240 | $6 \times 10^{-2}$ Torr | $3 \times 10^{-4}$ Torr | 90 |
| Fomblin Y16 | 2,600 | 0.06 Torr | $3.5 \times 10^{-5}$ Torr | 60 |
| Fomblin Y06 | 1,820 | 1.3 Torr | $2.5 \times 10^{-3}$ Torr | 28 |
| Fomblin Y04 | 1,460 | 3.5 Torr | $7 \times 10^{-3}$ Torr | 16 |
| Fomblin Y02 | 1,170 | 6 Torr | $4.6 \times 10^{-2}$ Torr | — |

Fomblin YU is the undistilled fluid comprising a mixture of the YR, Y25, Y16, Y06, Y04 and Y02 fluids. The vapor pressure given in the Table for Fomblin YU is that at which the lightest AMU fluid, Fomblin Y02, distills first. Other mixtures of the Fomblin fluids can be compounded to obtain desired ranges of viscosity.

The described class of inhibitor fluids are clear and colorless, resist oxidation and chemical attack and are soluble in a number of solvents to facilitate application onto surfaces in a manner to be described. Most importantly the described inhibitor fluids are relatively noncontaminating for use in vacuum deposition. The word noncontaminating means in this context that the fluids do not create undesirable interference with vacuum deposition processes.

In the method of the invention the surfaces upon which deposition is to be inhibited are coated with a thin film of one of the described perfluoropolyether fluids, with the uncoated surfaces remaining free to receive the condensing material. It is believed that the principle of operation is that the inhibitor fluid prevents nucleation of the incident atoms. Without nucleation the arriving atoms cannot cluster and thus rebound off the surface in random directions until arriving at a surface where they can nucleate and form a film, such as on the target. Irrespective of the exact mode or principle of operation, I have found that a thin film coating of perfluoropolyether is effective in inhibiting the subsequent vacuum deposition of a wide range of materials, including metals and carbon. Surfaces within a vacuum chamber or bell jar which have been coated with the inhibitor fluid are found to be remarkably clear of the condensing material while adjacent uncoated surfaces are coated with a layer of the material.

The inhibitor fluids of the invention can readily be applied to a wide range of substrate materials which form the surfaces exposed to the vacuum deposition process. Among the surfaces with which the invention has application are glass, e.g. the inner surfaces of a bell jar or sight glass; metal or alloyed metal, e.g. for depositing decorative or utilitarian patterns onto metal surfaces; synthetic polymers, e.g. plastic substrates; paper or cardboard, e.g. for printing labels on products; dielectrics or oxides, e.g. materials forming semiconductor bodies. It is understood that the invention is not limited by the type of surface upon which the inhibitor fluid is coated.

B. Spray Application of Inhibitor Coating

The surfaces upon which deposition is to be inhibited can be coated with the inhibitor fluid in a number of precedures depending upon the particular application in which the invention is to be used. One method of application is by spraying to obtain a relatively thin, uniform coating of the inhibitor fluid over selected portions of a substrate surface.

The spray fluid comprises a volume of perfluoropolyether of the desired molecular weight, such as Fomblin YR or Fomblin Y25, in a solution with a suitable liquid diluent or solvent, or in 100% concentration. Preferably the solvent is perfluorinated hydrocarbon such as trichlorotrifluoroethane sold under the trademarks Freon 113 or Freon TF by the DuPont Company. Such a solvent serves as a carrier for the inhibitor fluid and is volatile so as to evaporate after the solution is sprayed onto the surfaces. The composition of the solution preferably is in the range of 0.1% to 100% by volume of inhibitor fluid. Solutions of 0.5% by volume inhibitor fluid will achieve satisfactory results. The fluid in either 100% concentration or solution form can be sealed within a container such as an aerosol can together with a suitable volatile propellant such as tetrafluoromethane sold under the trademark Freon 14 by the duPont Company. The propellant serves to propel the solution from the can in the spray, and it quickly evaporates after hitting the substrate. The concentration of propellant in the aerosol container preferably is in the range of 25% to 35% propellant by volume. A propellant concentration of 33% by volume gives satisfactory results. The propellant can also comprise air or nitrogen gas under pressure within the aerosol container. The inhibitor fluid in either 100% concentration or solution form can also be sprayed onto the surface by means of a suitable air brush. Repeated passes can be made by the spray across the substrate surface from either the aerosol can or air brush until a film of the desired uniformity and thickness is obtained.

The thickness of the coating or film of inhibitor fluid on the surface can be varied according to the results which are desired. Satisfactory results are achieved with inhibitor coatings having thicknesses in the range of about 0.1 to 10μm. The coated surface should be mounted at a sufficient distance from the vapor source so that radiant energy from the source does not heat the inhibitor fluid above its evaporation temperature, otherwise the fluid would boil away and the coating would lose its effectiveness. The separation distance would depend on a number of variables, including the evaporation temperature and amount of the source material to be deposited, and the type of substrate upon which the coating is formed. Separation distances on the order of four or more inches are sufficient in many cases for this purposes.

C. Application by Spin Coating

Another method of applying a coating or film of the inhibitor fluid is by spin coating. The substrate which is to be coated, such as a 3 inch × 3 inch area surface, is placed on a suitable motor-driven rotary chuck mounted in a bowl. A quantity of inhibitor fluid of about 15 to 20 drops (7 to 10 mm³/drop), in either 100% concentration or in a solution with a suitable liquid diluent or solvent, such as carbon tetrachloride, is deposited on the substrate surface. A solution of 1% by volume Fomblin Y25 mixed with Freon TF gives satisfactory results. The motor is turned on to spin the substrate at a speed within the range of 2,500 to 10,000 r.p.m. for a time on the order of 30 to 60 seconds. The inhibitor fluid is distributed evenly over the surface to form a thin film by the action of centrifugal force, with excess fluid being thrown off at the edges of the surface. The thickness of the resulting film can be varied, as desired, by selecting a species of inhibitor fluid with the desired viscosity, by selecting the desired volatility of the solvent where the inhibitor fluid is in solution, or by varying the spinning speed or the duration of the spinning process.

D. Application by Evaporation

Another method of applying the coating is by evaporating the inhibitor fluid within a vacuum to form a vapor steam which deposits upon the desired substrate surface. FIG. 1 illustrates schematically the application of this method by means of a vacuum chamber or bell jar 10 in which a substrate 12 is mounted by a suitable support, not shown. A conventional vacuum system is employed to evacuate the interior of the bell jar. The vacuum system can include a mechanical and/or diffusion pump connected through a conduit 14 into the bell jar. A vapor source 16 such as a crucible for supporting the material which is to be deposited on the substrate is mounted within the base of the bell jar, and an electrical resistance type heating coil 18 is provided for heating this source to the material's evaporation temperature. The vapor source 16 can also comprise a resistance heating type filament about which the material is plated or supported in a coil. An additional vapor source 20 is mounted within the bell jar and an additional electrical resistance type heating coil 22 is provided around this source for heating the inhibitor fluid to its evaporation temperature. The substrate 12 upon which an inhibitor coating 24 is to be applied can be any structure of the type previously described, e.g. a printed circuit board or semiconductor body. The inner surface of the bell jar itself can be coated as a protection against undesirable deposits. The material of the chamber or container within which the inhibitor fluid is evaporated should not include materials such as aluminum or magnesium which would react with the fluid and cause premature decomposition. Preferably the material of the vacuum chamber is glass or quartz.

The perfluoropolyether inhibitor fluid is placed on the vapor source 20 in an amount, such as one or more drops (1 to 10mm³/drop), which is predetermined according to the surface area and thickness of the inhibitor coating which is to be applied. The drops can be in a concentration of 100% inhibitor fluid or in a solution of up to about 50% by volume inhibitor fluid with a suitable liquid diluent or solvent, such as Freon TF. One drop of 100% inhibitor fluid has been found effective to form a protective coating on the inner surfaces of a 18 inch dia. × 24 inch high bell jar, while up to ten drops of the fluid is effective for coating a 6 feet dia. × 3 feet vacuum chamber. Proportionally larger amounts of fluid would be required for larger size chambers.

The perfluoropolyether is evaporated from vapor source 20 by resistance heating to a temperature in the range of 176° F to 600° F, depending upon the molecular weight of the particular inhibitor fluid which is selected. The evaporation preferably is carried out in a vacuum in the range of $10^{-1}$ to $10^{-7}$ Torr or better. Satisfactory inhibitor vapor streams can be achieved by heating, at a vacuum level of $10^{-4}$ Torr, the fluids at the following temperatures: Fomblin YR at or above 518° F; Fomblin YU in the range of 176° to 266° F; Fomblin Y25 in the range of 374° to 554° F; Fomblin Y16 in the range of 356° to 464° F; Fomblin Y06 in the range of 284° to 392° F; Fomblin Y04 in the range of 176° to 410° F; and Fomblin Y02 in the range of 176° to 266° F.

The vapor deposition of perfluoropolyether can also be carried out in an inert atmosphere such as helium or argon, in a nitrogen atomsphere, or in air. When evaporating the fluid in air, the fluid is heated to a temperature in the range of 400° to 500° F; temperatures higher than 500° F are undesirable because of the reaction with oxygen and decomposition of the fluid. It has been found that evaporation of the inhibitor fluid can be carried out at atmospheric pressure. However, the resulting inhibitor film which is deposited tends to be non-uniform and thus is not preferred for certain applications. For most applications the inhibitor fluid is evaporated at or below a vacuum level of $10^{-4}$ Torr.

The thickness of the deposited film of perfluoropolyether can be selectively varied by changing factors such as the rate of evaporation of the fluid, the distance of the substrate from the vapor source, the orientation and location of the substrate with respect to the source, and the time allowed for vapor deposition. Suitable film thickness on the order of 0.1 to 10 μm can be achieved by placing a single drop of the perfluoropolyether fluid in the vapor source within a bell jar of the type illustrated in FIG. 1 and of a size on the order of 18 inches in diameter and 24 inches in height. The bell jar is then evacuated and the vapor source 20 heated according to the temperatures described above for the selected inhibitor fluid. The desired substrate 12 is positioned within the bell jar at a distance on the order of 6 inches from and in a plane normal to the source. The vapor source is heated for a time period in the range of 1 second to 1 minute. The longer heating times provide a more uniform coating on the substrate, although it is desirable to avoid heating for longer than about one minute to preclude overheating and decomposition of the fluid. Suitable inhibitor coatings of uniform thickness can be achieved with evaporation times within the range of 10 to 15 seconds.

Another method which can be utilized for evaporating the inhibitor fluid within a vacuum chamber or bell jar is by heating in a vacuum a suitable material of open-cell structure into which perfluoropolyether inhibitor fluid is absorbed. Such material can comprise a sintered sponge-like metal such as sintered stainless steel, cellular ceramic, cellular glass, or cellular quartz and the like. The cellular material can be formed in units of a suitable configuration such as a strand of wire, flat strips or any geometric shape such as spherical or cylindrical. Spherical cellular pellets of ¼ inch diameter or cylindrical pellets of ¼ inch diamter by ¼ inch length are satisfactory.

The cellular units can be impregnated with the inhibitor fluid by placing one or more of them into a vessel containing the inhibitor fluid in 100% concentrate. The container is then placed in a vacuum in the range of about $10^{-1}$ to $10^{-4}$ Torr so as to replace the air in the voids of the cellular structure by the fluid. The vessel is removed from the vacuum, the cellular units removed and any surplus fluid removed from the outside of the units by means such as by wiping.

The procedure for evaporating the inhibitor fluid from the impregnated cellular units is carried out by placing one or more of the units, depending upon the surface area to be coated, within a bell jar or vacuum chamber, and then drawing a vacuum on the chamber to a pressure in the range of about $10^{-2}$ to $10^{-4}$ Torr. The units are then slowly heated to a temperature in the range of about 200° F to 600° F for obtaining even distribution of the vapor stream so that a uniform coating is applied. The units can be heated by resistance heating, such as by placing the units between electrode plates connected with a current source, or by placing the units within an r.f. coil where the cellular unit comprises a nonelectrical conductive material such as quartz or glass. The heating can also be achieved by thermal conduction or radiation. In any case, temperatures above 600° are to be avoided to prevent undesirable decomposition of the inhibitor fluid.

E. Application by Printing Processes

Another method of applying a coating of the inhibitor fluid onto a substrate surface is by a printing process in which the inhibitor fluid in either 100% concentration or in a solution with a suitable liquid diluent or solvent comprises the printing "ink". Printing techniques which can be employed are relief printing such as letterpress or flexography, planographic printing such as offset lithography, gravure, and screen printing such as silk screen process printing.

The printing "ink" solution can be prepared by dissolving a perfluoropolyether fluid of the class previously described in a concentration of 0.1% to 100% by volume fluid with a solvent such as Freon TF or perfluoro octane. Freon TF is preferred and has a relatively low volatility.

Figure 2:
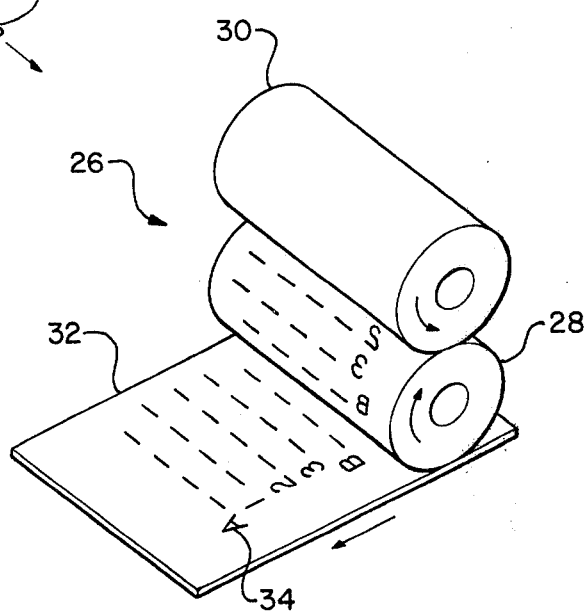
FIG. 2 is a schematic perspective view showing a method of the invention in which the inhibitor fluid is deposited onto a surface in a selected pattern by a printing process.

FIG. 2 illustrates schematically a suitable printing mechanism 26 of the relief printing design adapted for use with the method of the invention. Printing mechanism 26 includes a plate cylinder 28 and "ink" cylinder 30 both of which are rotatably mounted by suitable means above a suitable platen upon which the desired substrate 32 is carried for linear movement below the plate cylinder. The predetermined pattern which is to be printed on the substrate is molded in reverse into a suitable relief plate by conventional printing procedures such as by electrotype or stereotype. A layer of inhibitor fluid in either 100% concentrate or as a solution of up to 50% by volume with a suitable liquid diluent or solvent such as Freon TF is spread in a coating over ink roll 30. The fluid layer is picked up by plate cylinder 28 which in turn prints the fluid in the pattern 34 on the substrate in the manner illustrated in FIG. 2. The substrate is then placed into a vacuum chamber or bell jar whih is then evacuated and the desired source material, such as a metal or carbon, is formed into a vapor stream by evaporation or by cathode sputtering techniques. The material is inhibited from depositing upon the surface portions which are printed with the perfluoropolyether while it is deposited on the remaining surface portions.

F. Printing With Thixotropic Paste

A thixotropic paste comprising a species of the inhibitor fluid mixed with a highly viscous thickener can be coated onto surfaces for preventing vacuum deposition of evaporatable materials. The thixotropic paste can be applied to selected portions of the surface or substrate as a printing "ink" by the printing processes described above, such as by offset or screen printing.

The paste or printing "ink" is prepared by mixing one of the above-described species of inhibitor fluids, e.g. Fomblin YR, with a thickener such as finely pulverized tetrafluoroethylene (Teflon), finely pulverized alumina or a viscous silicon grease. The Teflon and alumina are pulverized to an average particle size of up to about 1 $\mu$m. A silicon grease suitable as a thickener is that sold under the trademark Four Compound by the Dow Corning company. Preferably the thixotropic paste is mixed in the proportions, by volume, of about one part inhibitor fluid and two parts thickener.

For application by screen printing a screen is selected with a suitable mesh size, such as 1,000 mesh. Selected areas of the screen are covered by a mask or shield leaving the open areas to form the printing pattern. The screen is placed over the substrate and the thixotropic paste applied over the screen so that the paste flows through the mesh openings and coats the underlying surface to a thickness on the order of 2 or more $\mu$m. The screen is removed and the substrate placed in a vacuum chamber for the deposition process. Deposits of the source material are thereby formed only on the uncoated surfaces. Following deposition the residual paste is removed by rinsing with a suitable solvent such as Freon TF.

G. Pattern Formation By Laser Beam Exposure

The invention has application in forming a masking structure on a substrate surface so that the vapor stream from a subsequent vacuum deposition process will deposit only on the surfaces not covered by the masking structure. The masking structure comprises a thin film of the inhibitor fluid on a surface from which selected portions of the film has been removed leaving a pattern of the fluid. The resulting masking structure is adapted for use in a wide variety of applications including the fabrication of electrical devices such as thin film resistors and capacitors, the fabrication of semiconductor devices and integrated circuits, the formation of electronic device interconnection patterns and electronic device packaging, the fabrication of photoelectric devices, the fabrication of optical devices requiring thin film deposition in selected areas, and the formation of pellicles, i.e. extremely thin membranes formed in patterns for purposes such as optical filters.

Figure 3:
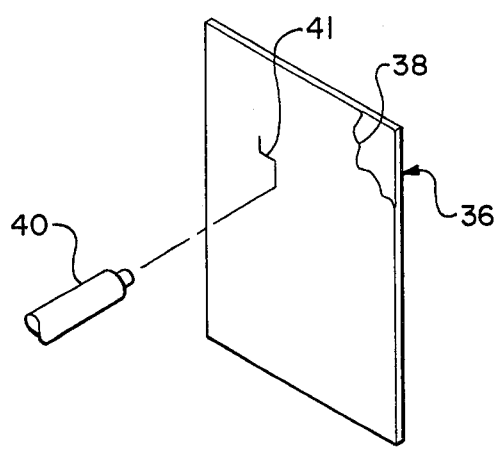
FIG. 3 is a schematic perspective view of a method of the invention in which a masking structure is formed by means of projecting an energy source in a beam along a path across a substrate surface to evaporate the inhibitor fluid along the path.

One method of the invention for removing the inhibitor fluid from the substrate surface to form the pattern is by projecting a high energy electromagnetic beam in a path across the substrate so that the absorbed energy causes the fluid to heat up and evaporate along the path. FIG. 3 illustrates schematically a substrate 36 upon which a masking structure is to be formed by the steps depicted in FIGS. 4 through 7. A thin film 38 of the selected perfluoropolyether inhibitor fluid is applied to the substrate surface by the methods previously described such as by spin coating, spraying, or evaporation. The substrate is then set up as a target in front of a suitable beam generator 40. The beam generator preferably comprises a laser which is adapted to emit a coherent laser beam having a wavelength which is in the range of the energy absorption band of the inhibitor fluid. The perfluoropolyether fluids used in this invention have an energy absorption peaks in the infrared and thus it is preferred that the beam wave number be in the range of about 950 cm$^{-1}$ to 1450 cm$^{-1}$. A laser tube having $CO_2$ as the active gas is preferred for generating radiation within this wavelength range. The laser beam can be moved across the substrate along a predetermined path 41 by a suitable programmed control circuit. Electromagnetic beam writing techniques can be used to remove the inhibitor fluid from selected areas, and by such techniques linewidth resolution of down to about 10 to 20 microns can be achieved.

Figure 4:
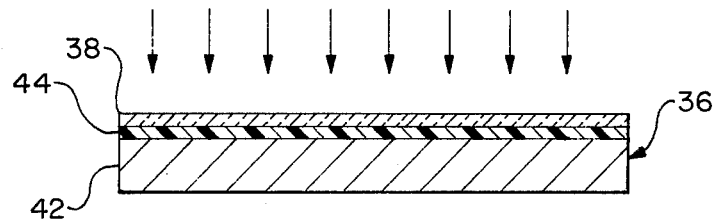
FIG. 4 is a fragmentary cross sectional view of a substrate illustrating the method of formation of a masking structure of the invention in which the inhibitor fluid is being condensed upon a surface of the substrate.
Figure 5:
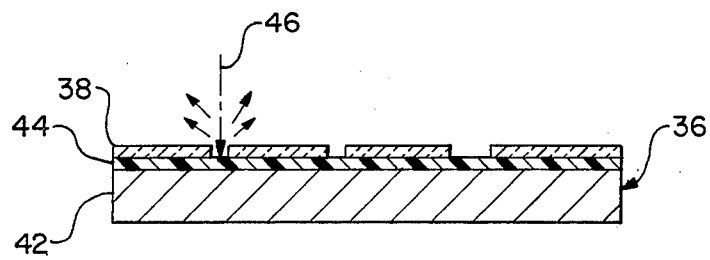
FIG. 5 is a view similar to FIG. 4 showing the evaporation of the inhibitor fluid from the coating along a predetermined path.
Figure 6:
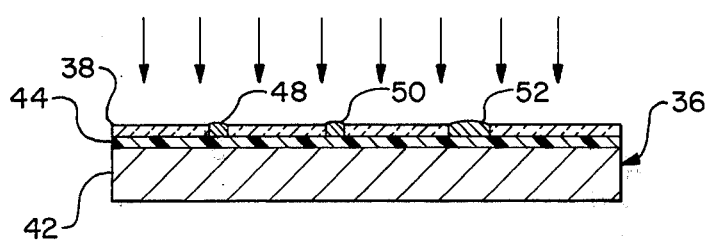
FIG. 6 is a view similar to FIG. 5 showing the deposition of evaporatable material along the path and the inhibiting of such deposition over the coating of the fluid.
Figure 7:
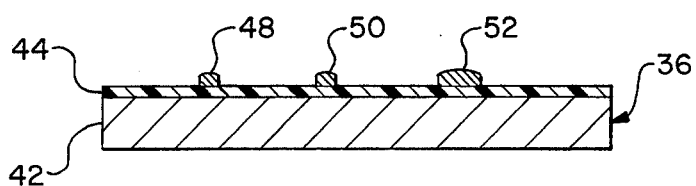
FIG. 7 is a view similar to FIG. 6 showing the removal of the remainder of the inhibitor fluid leaving a pattern of condensed material upon the substrate.

The method of forming the patterns by the beam writing techniques is illustrated schematically in FIGS. 4–7. In FIG. 4 the substrate 36 is depicted, as an example, as a metal body 42 upon which an overlying layer 44 of insulative material has previously been deposited. The thin film 38 of the inhibitor fluid perfluoropolyether is deposited over the insulating layer by any one of the previously described methods. In FIG. 5 a writing beam 46 from the laser tube is shown as being directed along a predetermined path across the surface to evaporate the inhibitor fluid along the path and form the patterned masking structure. The substrate is then mounted within a vacuum chamber above a vapor source of the desired deposition material, such as a metal where it is desired to form electrical conductive paths or interconnections between points in one or more of the substrates. The vapor source is heated to its evaporation temperature under a vacuum. The resulting vapor stream from the source is shown in FIG. 6 as impinging on the substrate, with deposition taking place over the insulating layer along the paths 48, 50, 52 while being inhibited from depositing over the masking structure formed by the fluid. The residual inhibitor fluid of the masking structure can then be removed by suitable means such as rinsing in a suitable solvent, e.g. Freon TF, and the dissolved solution is removed leaving the substrate illustrated in FIG. 7 with the metal deposited in the desired pattern. As required by the particular application, additional pattern layers can be formed over the structure shown in FIG. 7 by repeating the steps of coating the surface with the inhibitor fluid, removing the fluid from selected areas by a laser beam, and vacuum deposition of the material which is to be deposited in the next layer.

In the foregoing method the use of a substrate which is either infrared transparent or strongly reflecting will permit short period exposures from a $CO_2$ laser source without overheating of the substrate. The avoidance of substrate heating minimizes evaporation through conduction in the substrate and thereby increases line resolution. Germanium or sodium chloride are suitable infrared transparent substrate materials, while a metal such as aluminum is a suitable infrared reflecting substrate material.

FIG. 8 illustrates typical electronic device interconnections made by the method of the invention. An integrated circuit chip 56 having contacts or bonding pads 58, 59 is positioned on a support surface within a lead frame 60 having terminals 62, 63. A coating of inhibitor fluid is applied over the chip, support surface and lead frame. Portions of the coating along paths leading between the desired pairs of contacts and terminals are removed by means such as the described laser beam exposure method. The structure is placed within a vacuum chamber and a metal such as gold or silver is evaporated and deposited on the paths to form the interconnection leads 65, 66.

Another method of forming patterns is by coating a substrate with a suitable inhibitor fluid to a desired thickness and then projecting a timed exposure of a large diameter, e.g. 1 inch to 2 inches, $CO_2$ laser beam through an infrared opaque mask, e.g. a metal mask, onto the substrate. Mask magnification or demagnification can be achieved by routing the beam through a suitable optics system such as a germanium lens system or an infrared reflecting surface, e.g. a parabolic mirror.

H. Pattern Formation by Electron Beam Exposure

Another method of removing the inhibitor fluid from selected areas of a substrate to form a masking structure is by directing an electron beam along a predetermined path across a thin film of the fluid covering the substrate. The energy of the impinging beam heats up and volatizes the inhibitor fluid along the path. Linewidth definitions in the masking structure on the order of 5 to 10 microns can be achieved by this procedure. Smaller resolution is limited due to the thermal conduction and due to possible rediffusion of the inhibitor fluid into areas from which it has previously been removed. Following removal of the fluid in a predetermined pattern from the substrate, vacuum deposition is carried out in the previously described manner to form deposits of material in the pattern on the substrate.

I. Pattern Formation by Rinsing

Another method of removing selected areas of the inhibitor fluid is by rinsing these areas with a suitable solvent, such as Freon TF. The solvent can be applied in a predetermined pattern onto the surface by means such as a spray or a jet, with the dissolved inhibitor fluid being permitted to run off of the substrate, leaving the exposed surface. Subsequent exposure of the substrate to a vapor stream of material will result in deposition only upon the pattern of the surface which has been rinsed.

J. Removal of Residual Inhibitor Fluid

Following a vacuum deposition process in which a material has been deposited onto a substrate formed with an inhibitor fluid masking structure of the invention, the residual fluid which forms the masking structure is removed by rinsing with a suitable solvent, such as Freon TF. One method is by spraying the surface with the solvent and allowing the dissolved inhibitor fluid to drain off. Another method is by rotating the substrate about an axis and squirting the solvent against the rotating substrate. The inhibitor fluid is dissolved into a solution which is spun off the substrate by centrifugal force leaving the surface clean for any subsequent deposition processes.

K. Method of Vacuum Deposition

The method and masking structure of the invention has application in various known vacuum deposition processes for forming thin films, such as thermal evaporation in vacua and cathode sputtering in vacua. The invention can be used for inhibiting the vacuum deposition of carbon and of a wide range of metals which include aluminum, gold, silver, copper, chromium, platinum, palladium, iron, lead, antimony, nickle and tin, and alloys of these metals. Vacuum deposition of the metals is carried out using conventional thermal evaporation equipment including a vapor source which supports the evaporant metal and supplies the heat of vaporization while maintaining the metal at the required temperature to produce the desired vapor pressure for generating a vapor stream which provides useful film condensation rates. The vacuum maintained during the deposition is on the order of $10^{-4}$ Torr or better. The deposition of carbon can be carried out through conventional carbon arc procedures.

L. Method of Reflecting Vapor Stream

The invention provides a method for reflecting or redirecting a vapor stream of source material toward the target object so that the material can deposit uniformly over the object, particularly on surfaces not in direct line of sight with the source. As a result it is possible to form more or less uniformly deposited films or coatings on cavities, holes, channels and other irregular surfaces, as well as on a reverse side of the object remote from the source. At the same time the requirements for providing multiple evaporation sources or planetary devices for rotating the object are eliminated. Vapor streams of a source material such as from metal evaporation or carbon arc sputtering are reflected from their straight line paths radiating from the source by a surface within the vacuum chamber formed with a coating of one of the previously described inhibitor fluids. As used herein the word "reflect" means that atoms of the vapor stream which are incident upon the coated surface are reflected, repelled or otherwise redirected in random directions away from the coated surface. It is believed that the principle of operation in reflecting the vapor stream is that the inhibitor fluid prevents nucleation, as described above. The atoms can be successively reflected from the coated surfaces until they deposit on a nucleating surface, such as the target. Irrespective of the exact principle of operation, a surface coated with a thin film of the inhibitor fluid in accordance with the invention exhibits a remarkable and surprising ability to reflect such a vapor stream.

The reflecting surface can advantageously comprise the inner surface of a vacuum chamber, or the bell jar 68 as depicted in FIG. 8. A thin film 70, e.g. 2000 to 3000 A, of a species of the inhibitor fluid can be coated by means such as spraying across the inner surface of the bell jar. The spray fluid can comprise the previously described Fomblin YR or Fomblin Y25 in solution with a liquid diluent or solvent, such as Freon 113 or Freon TF, or the inhibitor fluid can be in 100% concentration. The target object such as the pair of illustrated substrates 72, 74 formed with a plurality of through holes 75, 76 are mounted by a suitable support, not shown, within the bell jar. The substrates can be orientated at any desired angle with respect to an evaporative source 78 which is disposed in a suitable boat or crucible on the floor of the bell jar. Thus the inner reflecting surface of the bell jar substantially surrounds the substrate so as to enhance uniform coating of the target surfaces by direct impingement from the source as well as from indirect reflection. At the same time the coated surfaces of the bell jar are sufficiently remote from the heated source so that the radiant energy from the source is insufficient to heat the inhibitor fluid above its evaporation temperature. Premature evaporation of the inhibitor coating is thereby avoided so that the reflective properties of the coating are maintained, and repeated deposition jobs can be completed without reapplication of the coating. As required, other reflecting surfaces, such as flat or curvilinear structures, can be coated with the inhibitor fluid and then used in addition to or as a replacement for the coating on the bell jar surface.

In the method of FIG. 9 bell jar 68 is evacuated through conduit 80 to the vacuum level required for the particular deposition process. The source material is heated to create a vapor stream of material which radiates outwardly. Vaporized atoms impinging directly upon the lower exposed surfaces of the substrates deposit on these surfaces while the remaining portion of the vapor stream successively reflects in random directions from the coated surfaces of the bell jar. This creates a large number of atoms in a vapor phase traveling in random directions so that after a period of time, such as on the order of one or two minutes, deposits are formed on substantially all surfaces of the object, including the through holes and reverse sides which are not in line of sight with the source.

The vapor stream reflecting method can be employed to provide interconnection between electronic devices, not shown, on opposite sides of the substrate 82 of FIG. 10. Substrate 82 comprises a suitable dielectric material formed with a plurality of through holes 84. A pair of mechanical masks 88, 90 are provided, such as brass or stainless steel foil with a thickness on the order of 0.020 inch. Apertures 92, 94 are formed in the foil by suitable photolithography and etching techniques, with the apertures in register with and of a slightly larger diameter than the through holes. The substrate is placed within a vacuum chamber having its inner surface formed with a coating of the inhibitor fluid by the method described in connection with FIG. 9. A source material of a suitable conductive metal such as aluminum is evaporated under vacuum, with the vapor stream depositing in a film 96 upon the mask surfaces as well as the exposed surfaces of the substrate and through holes. The masks are then removed leaving the deposited metal forming electrical interconnects within the holes. The metal also forms circular collars 98, 100 about opposite ends of the holes. The collars provide contact areas for connecting with leads to the devices on the substrate.

The vapor stream reflecting method of the invention can also be employed in combination with the previously described inhibitor fluid masking structure to form interconnections between devices, not shown, on opposite sides of the substrate 102 of FIG. 11. A plurality of through holes 104 are formed in the substrate. The opposite sides 106, 108 of the substrate are coated with layers 110, 112 of a species of inhibitor fluid by the method described in connection with FIGS. 4–7. Areas of the inhibitor fluid coating within and around the through holes, as well as other desired pattern areas on either side of the substrate, are removed by means such as the previously described laser writing techniques or by laser beam exposure through an opaque mask. A pattern of inhibitor coating could also be formed by printing with a thixotropic paste as described above. The substrate is then placed within a vacuum chamber or bell jar, the inner surface of which is coated with the inhibitor fluid as described in connection with FIG. 9. A source material such as aluminum is evaporated under vacuum so that the direct and reflected vaporized atoms deposit in a film 114 upon the exposed surfaces of the through holes, but are prevented from being deposited upon the coatings of inhibitor fluid. The residual inhibitor fluid is then removed by means such as a rinsing with a solvent to leave the deposited metal film as device connections.

The methods of the invention can be advantageously employed for improving the wettability of solder onto surfaces which are not easily wettable with solder, such as a ceramic. In such case it is possible to form solder interconnections through holes of a ceramic substrate in the manner of FIGS. 9 and 10. The source material used is of the type easily wettable by solder, such as copper, and this material is vapor deposited into the through holes by the described vapor stream reflecting methods. Solder is then deposited on the copper metal in the through holes to form interconnects between devices on opposite sides of the substrate.

The vapor stream reflecting methods of the invention can be employed in the manufacture of integrated circuits. FIG. 12 illustrates a substrate 116 of a semiconductor material such as silicone doped with either p- or n- type impurities. Regions 118 of opposite conductive type, and region 120 of the same conductive type, are formed by conventional procedures, which typically include the formation of an oxide layer 122 into which windows 124 are cut by photolithographic and etching techniques.

The etched edges of the windows 124 in the oxide layer form steep or vertical slopes and valleys extending down to the substrate. The deposition of a material, such as a metal, over the etched layers by conventional vacuum deposition processes does not produce layers of uniform thickness along these slopes. This problem is overcome in the present invention by mounting substrates formed with these etched layers within a vacuum chamber or bell jar coated with an inhibitor fluid as in the method of FIG. 9. The source material, e.g. aluminum, is then evaporated under vacuum and deposited in a film 126 over the substrates and oxide layer, with portions of the vapor stream being reflected from the bell jar so as to deposit along the etched slopes and into the valleys. Undesired portions of the metal are then removed as by photoengraving to leave interconnected stripes between the different regions.

The vapor stream reflecting method makes it possible to form relatively uniform coatings of a source material onto objects having highly irregular surfaces, such as biological specimens, e.g. insects. Conventionally, biological specimens are coated with a conductive material such as carbon or a metal for examination with a scanning electron microscope. The irregular nature of the surfaces are such that it has heretofore been difficult to obtain uniform coatings, even where the specimen is rotated by a planetary device during the deposition process. In the present invention the specimen is mounted within a vacuum chamber or bell jar, the inner surface of which is coated with an inhibitor fluid as described in the method of FIG. 9. A conductive non-metallic such as carbon, or a metal such as gold, silver or palladium, is evaporated under a vacuum to form the vapor source. The vaporized atoms from the source are reflected from the coated surfaces and deposit into the irregular surfaces and cavities of the specimen so that a uniform coating is achieved suitable for examination by the electron microscope.

M. Examples

Examples of the use of the invention in various vacuum deposition processes and applications are as follows:

EXAMPLE I

A substrate of germanium of 3 inches diameter is mounted within a bell jar 10 of the type illustrated in FIG. 1 at a distance of 6 inches from and normal to vapor source 20. One drop (about 3 mm$^3$) of Fomblin Y25 inhibitor fluid in 100% concentration is placed upon the source. The bell jar is evacuated to a pressure of $6 \times 10^{-4}$ Torr and the source is resistance heated to heat the fluid to a temperature of 374° F for a period of 15 seconds. The fluid evaporates into a vapor stream which is deposited as depicted in FIG. 4 in a uniform film across the substrate. The substrate is then placed into position as a target for a $CO_2$ gas laser 40 in the manner illustrated in FIG. 3. The laser is controlled to direct its beam along a predetermined path across the substrate surface so that the fluid evaporates along the path to form a masking structure in the manner illustrated in FIG. 5. The substrate is then mounted in the bell jar at a distance of 4 inches from the vapor source 16. The vapor source 16 includes chromium metal electroplated onto a tungsten element connected to the electrical power supply. The bell jar is evacuated to a pressure of $10^{-5}$ Torr, and the filament is resistance heated to a temperature of 1400° C so that the chromium undergoes sublimation to form a vapor stream. This vapor stream deposits upon the substrate surfaces exposed by the masking structure, but is inhibited from being deposited upon the coated surfaces. The residual inhibitor fluid is rinsed off with Freon TF and the substrate is now ready for any desired subsequent processing.

EXAMPLE II

In this example a gold pattern is to be fabricated on a substrate of alumina. The substrate is mounted in bell jar 10 at a distance of 6 inches from and normal to the vapor source 20 as shown in FIG. 1. A ¼ inch diameter spherical pellet of sintered stainless steel is vacuum saturated with Fomblin YR inhibitor fluid in 100% concentration. The pellet is placed onto the source between electrodes connected with a power source and the bell jar is evacuated to a pressure of $5 \times 10^{-4}$ Torr. An electric current is passed through the pellet which is resistance heated to a temperature of 518° F for 10 seconds. The fluid is evaporated from the pellet and forms a vapor stream which deposits across the surface of the substrate in a uniform coating. The substrate is then mounted in front of a $CO_2$ gas laser which projects a 2 inch diameter beam. A metal mask shaped in a pattern and a focusing lens system are set up in the path of the beam so that an image floods the substrate during a short burst of the laser causing the coating to evaporate over an area of the pattern to form a masking structure. The substrate surface is then mounted within the bell jar at a distance of 4 inches from vapor source 16, which comprises a pair of gold disks of 0.005 inch thickness supported in a crucible of molybdenum. The bell jar is evacuated to a pressure of $3 \times 10^{-5}$ Torr, and the gold is resistance heated in the crucible to a temperature of 1400° C. The gold evaporates to form a vapor stream which deposits along the path formed over the substrate but which is inhibited from being deposited upon the remaining coating. The residual inhibitor fluid is now removed as in Example I.

EXAMPLE III

In this example aluminum is to be deposited in a pattern on a brass substrate to form a nameplate for a product. The desired pattern is formed into a relief printing plate which is mounted on the plate cylinder 28 in a printing mechanism of the type illustrated in FIG. 2. A solution of Fomblin Y25 inhibitor fluid is mixed with Freon TF solvent in a concentration of 0.5% by volume of the inhibitor fluid. The solution is applied at ambient temperature onto the ink cylinder 30 and the mechanism operated for printing the pattern of fluid onto the substrate surface 32. The printing is carried out at one atmosphere of pressure. The substrate is then mounted within a bell jar at a distance of 6 inches from and normal to a vapor source comprising a strand of aluminum wound about a tungsten filament connected to an electrical power source. The bell jar is evacuated to a pressure of $10^{-5}$ Torr, and the aluminum is resistance heated to a temperature of 1220° C. A vapor stream of the aluminum is deposited onto the portions of substrate surface not coated with the fluid pattern. The residual inhibitor fluid is now removed as in Example I.

EXAMPLE IV

In this example the method of the invention is employed to form a protective coating on the inner surface of a bell jar. A solution of Fomblin Y25 is mixed in the amount of 0.5% by volume with Freon TF solvent. The resulting solution is then combined with Freon 14 propellant into a 6 fl. oz. aerosol can in a concentration of 33% by volume propellant. The solution is sprayed in a uniform coating across the inner surfaces of the bell jar. A substrate having a masking structure formed by laser writing across a film or inhibitor fluid in the manner set forth in Example I is then placed within the bell jar at a distance of 4 inches from and normal with an evaporative source comprising a pair of silver disks of 0.005 inch thickness supported in a crucible of molybdenum. The bell jar is evacuated to a pressure of $10^{-5}$ Torr and the silver is resistance heated within the crucible to a temperature of 1030° C. A vapor stream of the silver is deposited onto the uncoated surface areas of the substrate body, but is inhibited from being deposited upon the inner surface of the bell jar as well as the coated areas of the substrate body. The residual inhibitor fluid is then removed as in Example I.

EXAMPLE V

In this example the method of the invention forms a pattern of aluminum on a germanium material. A germanium substrate of ½ × ½ plan dimensions is mounted on a rotatable base. Fomblin Y25 inhibitor fluid is prepared in a solution with perfluoro octane solvent in a concentration of 1% by volume inhibitor fluid. Twenty drops the solution at ambient temperature are spread across the surface of the substrate which is then spun at a speed of 5,000 rpm for 30 seconds to create a thin film of the fluid across the glass surface. The spin coating step is carried out at a pressure of one atmosphere. A pattern area of the film is evaporated to form a masking structure by flooding the substrate surface with a laser beam image in the manner described in Example II. Next the substrate is mounted within a bell jar at a distance of 4 inches from and normal to a vapor source comprising a strand of aluminum coiled about a tungsten filament. The bell jar is evacuated to a pressure of $10^{-5}$ Torr and the aluminum is resistance heated to a temperature of 1220° C. The resulting aluminum vapor stream deposits on the glass along the exposed path but is inhibited from being deposited upon the coated surfaces of the substrate. The residual inhibitor fluid is then removed as in Example I.

EXAMPLE VI

A solution of Fomblin Y25 is mixed with Freon TF solvent in a concentration of 0.5% by volume Fomblin Y25. The resulting solution is combined with Freon 14 propellant into a 6 fl. oz. aerosol can in the amount of 33% by volume propellant. The solution is sprayed from the can in a uniform coating across the inner surface of the sightglass of a vacuum chamber. This step is carried out at ambient temperatures and at a pressure of one atmosphere. An aluminum substrate of 3 inches × 3 inches plan dimensions is mounted within the vacuum chamber at a distance of 4 inches from and normal to a vapor source comprising a carbon arc device. The chamber is evacuated to a pressure of $10^{-5}$ Torr and the carbon arc is operated at a temperature on the order of 2600° C to create a carbon vapor stream which is deposited upon the aluminum substrate, but which is prevented from being deposited upon the inner surface of the sightglass permitting the deposition process to be clearly observed from outside the chamber.

EXAMPLE VII

A substrate of glass having 3 inches × 3 inches plan dimensions is mounted within a bell jar at a distance of 6 inches from and normal to the vapor source 20 within bell jar 10. One drop of Fomblin YR inhibitor fluid in 100% concentration is placed onto the source and the bell jar is evacuated to a pressure of $6 \times 10^{-4}$ Torr. The source is resistance heated to a temperature of 518° F for 20 seconds so that the fluid evaporates into a vapor stream which forms a thin coating on the glass substrate. The substrate is removed from the bell jar and a pattern area of the coating is evaporated by the laser beam image method described in Example II. A vapor source comprising palladium which is electroplated onto a tungsten filament is placed within the vacuum chamber at a distance of 4 inches from the substrate. The bell jar is evacuated to a pressure of $10^{-5}$ Torr and the filament heated to a temperature of 1600° C. The palladium undergoes sublimation into a vapor stream which deposits upon the rinsed areas of the glass but is inhibited from depositing upon the coated pattern.

EXAMPLE VIII

A substrate of alumina ceramic of 3 inches × 3 inches plan size, 0.050 inch thickness and with a plurality of 0.50 inch diameter holes is mounted within a bell jar at a distance of 8 inches from and normal to vapor source comprising copper plated in a tungsten boat. Previously formed electrical devices are provided on opposite sides of the substrate. A screen of 2,000 mesh size is masked to define patterns for metal deposition over the substrate. A thixotropic paste is prepared comprising, by volume, one part Fomblin YR inhibitor fluid mixed with two parts finely pulverized (up to about $1\mu m$ size) tetrafluoroethylene as a thickener. The screen is aligned across the sides of the substrate and the paste is applied through the screen and coated on the substrate to a thickness of $2\mu m$. The screen is removed and the substrate is then mounted within the bell jar at distance of 8 inches from the source, which comprises copper plated on a tungsten heater filament. A solution of Fomblin Y25 is mixed in the amount of 0.5% by volume with Freon TF solvent, and this solution is sprayed by an air gun across the inner surfaces of the bell jar to form a thin coating on the order of 2,000 – 3,000 A. The bell jar is evacuated to a pressure of $10^{-5}$ Torr and the copper is resistance heated to a temperature of 1,260° C for two minutes. The resulting vapor stream deposits directly and by reflection upon the substrate surfaces. the vapor is prevented from depositing upon the areas covered by the thixotropic paste. The residue of paste is then removed by dissolving and washing away with Freon TF solvent.

EXAMPLE IX

A silicon wafer forming an integrated circuit device includes a silicon substrate and a layer of silicon dioxide. Windows are etched in the oxide layer by photolithographic techniques with the etched edges of the layer defining steep slopes. The wafer is mounted within a vacuum chamber the inner surface of which is coated with an inhibitor fluid as described in Example VIII. The chamber is evacuated to a pressure of $10^{-5}$ Torr and a source comprising a strand of aluminum coiled about a tungsten filament is resistance heated to a temperature of 1220° C. The resulting vapor stream deposits with a uniform coating over the wafer as portions of the stream are reflected from the inhibitor fluid coating on the bell jar so as to deposit along the etched slopes and valleys of the oxide layer.

EXAMPLE X

A biological specimen comprising an insect is mounted within a bell jar at a distance of 8 inches from a 0.05 inch thick gold disc vapor source supported in a crucible of molybdenum. The inner surface of the bell jar is coated with inhibitor fluid in the manner described in Example VIII. The bell jar is evacuated to a pressure of $10^{-5}$ Torr and the gold is resistance heated in the crucible to a temperature of 1400° C. The resulting vapor stream deposits on the specimen with the portions reflected from the coated surface of the bell jar depositing within the cavities and irregular surfaces of the specimen.

While the foregoing embodiments are at present considered to be preferred, it is understood that numerous variations and modifications may be made therein by those skilled in the art and it is intended to cover in the appended claims all such variations and modifications as fall in the true spirit and scope of the invention.

What is claimed is:

1. A method for inhibiting the deposition of a vapor stream of material onto surfaces within a vacuum, comprising applying a coating of perfluoropolyether onto surfaces upon which said deposition is to be inhibited.

2. A method as in claim 1 in which the coating is applied by placing said perfluoropolyether in fluid form within a vacuum chamber which encloses the surfaces, creating an inhibitor film forming vacuum within the chamber, and evaporating said fluid within the chamber to create a vapor stream therefrom which is deposited onto said surfaces within the chamber.

3. A method as in claim 2 in which said film formimg vacuum is established at a pressure in the range of about $10^{-1}$ to $10^{-7}$ Torr, and said fluid is heated to a temperature in the range of about 176° to 600° F for evaporating the same.

4. A method as in claim 1 in which the coating is applied by placing into a vacuum chamber one or more units of an open celled material absorbed with said perfluoropolyether in fluid form, and evaporating the fluid from the units into a vapor stream directed onto the surfaces.

5. A method as in claim 1 in which the coating is applied by evaporating perfluoropolyether into a vapor stream directed onto said surfaces.

6. a method as in claim 1 in which the coating is applied by placing the perfluoropolyether in fluid form onto the surfaces, spinning the surfaces about an axis, and forming the fluid by the action of centrifugal force in a thin film coating over the surfaces.

7. A method as in claim 1 in which the coating is applied by spraying perfluoropolyether onto selected surfaces.

8. A method as in claim 7 in which the coating is applied by spraying a solution of perfluoropolyether and a solvent onto the selected surfaces.

9. A method as in claim 8 in which said solvent is selected from the group consisting of perfluoro octane and trichlorotrifluorethane.

10. A method as in claim 1 in which said coating is applied by printing a solution of perfluoropolyether and a solvent onto selected surfaces in a pattern having area portions upon which said deposition is to be inhibited.

11. A method as in claim 1 comprising applying said perfluoropolyether across the surface of a substrate, and removing the coating over predetermined portions of the substrate whereby the vapor steam of material is subsequently deposited on said portions of the substrate surface 12. A method as in claim 11 in which the step of removing the coating is carried out by directing an electro-magnetic beam along a predetermined path whereby the coating is evaporated along the path.

13. A method as in claim 12 in which said beam comprises a laser beam.

14. A method as in claim 13 in which the wavelength of said laser beam is established within the infrared radiation energy absorption band of said perfluoropolyether.

15. A method as in claim 14 in which the wave number of said laser beam is established within the range of about 950 $cm^{-1}$ to 1450 $cm^{-1}$.

16. A method as in claim 12 in which said substrate surface reflects electromagnetic energy to minimize overheating of the surface and coating.

17. A method as in claim 12 in which said substrate surface is formed of a material which transmits electromagnetic energy to minimize overheating of the surface and coating.

18. A method as in claim 11 in which the step of removing the coating is carried out by directing an electron beam onto the coating along a predetermined path whereby the coating is evaporated along the path.

19. A method as in claim 1 in which said coating comprises a thixotropic mixture of perfluoropolyether and a viscous thickener.

20. A method as in claim 19 in which the thixotropic mixture is applied to selected surfaces by disposing a screen over the surfaces with portions of the screen having mesh openings coextensive with the selected surfaces, and the thixotropic mixture is applied over the screen and through the mesh openings onto the selected surfaces.

21. A method as in claim 19 in which the viscous thickener is selected from the group consisting of finely divided tetrafluoroethylene, finely divided alumina and silicon grease.

22. A method as in claim 1 in which said material is selected from the group consisting of a metal and carbon.

23. A method as in claim 22 in which the metal is selected from the group consisting of aluminum, gold, silver, copper, chromium, platinum, palladium, iron, lead, antimony, nickel and tin and alloys of these metals.

24. A method as in claim 11 in which the coating is removed by dissolving the perfluoropolyether in a solvent applied on the surface portions, and removing the dissolved perfluoropolyether from the surface portions.

25. A method for inhibiting the deposition of a vapor stream of material onto a viewing window within a vacuum chamber during a vapor deposition process, comprising applying a coating of perfluoropolyether onto the inner surface of said viewing window.

26. A masking structure for forming a body having a material which is condensed on the body into predetermined patterns from a vapor stream of the material within a vacuum, including the combination of a substrate having a surface, a masking layer covering predetermined areas of the substrate surface and other areas of the surface upon which said material is to be condensed being uncovered by said layer, said layer being formed of perfluoropolyether.

27. A masking structure as in claim 26 in which said body comprises a semiconductor body which includes said substrate.

28. A masking structure as in claim 26 in which the body includes a plurality of terminals, and at least certain of said other areas being arrayed in paths between selected terminals whereby material condensed along the paths forms electrical conductive paths.

29. A masking structure as in claim 26 in which said body comprises a lead frame having terminals and at least one semiconductor chip having contacts, and at least certain of said other area of the surface being arrayed in paths which extend between selected lead frame terminals and selected contacts.

30. In a vacuum deposition process, the method including the steps of forming a layer of perfluoropolyether onto selected portions of the surface of a substrate having other surface portions upon which material is to be deposited, creating a vacuum about said surface portions, forming said material into a vapor stream, and depositing said material from the vapor stream onto the other surface portions while said layer substantially inhibits the deposition of said material onto the selected surface portions.

31. In a process as in claim 30, wherein said first mentioned step includes forming a layer of perfluoropolyether having an average molecular weight within the range of substantially 1,170 to 6,700 onto the selected surface portions.

32. In a process as in claim 30, wherein said substrate surface includes the surface of a semiconductor body, and said first mentioned step includes forming a layer of said fluid onto the substrate surface and removing portions of the layer which overlie said selected surface portions.

33. In a process as in claim 30, wherein the substrate surface includes terminals and said step of removing the portions includes evaporating the layer along paths which lead between selected terminals.

34. In a process as in claim 33 wherein the substrate comprises a lead frame having terminals and at least one semiconductor chip having contacts, and said first mentioned step includes evaporating the layer along paths which extend between selected terminals and selected contacts.

35. In a process as in claim 30 wherein the substrate comprises a printed circuit board, and said first mentioned step includes forming said layer into a predetermined pattern over the surface with said other portions of the surface being uncovered by the layer whereby the material deposited on the other portions forms electrical conductive paths of a printed circuit.

36. A method for inhibiting the deposition of a vaporized material onto surfaces within a vacuum, comprising the step of forming on said surfaces a layer of a compound having the general formula:

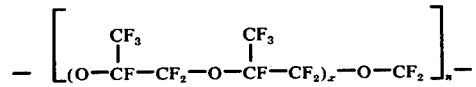

where x and n are integers.

37. A method as in claim 36 in which the compound has an average molecular weight within the range of 1,170 to 6,700.

38. A method as in claim 36 in which the layer is formed by evaporating the compound, and thereafter condensing the evaporated compound onto said surfaces.

39. A method as in claim 38 in which the evaporating step is carried out by heating the compound to above its distillation temperature in a gas selected from the group consisting of air, nitrogen, argon and helium, at a pressure of about one atmosphere.

40. A method as in claim 38 in which the evaporating step is carried out by heating the compound to a temperature in the range of about 176° F to 600° F at a pressure level below one atmosphere.

41. In a process for the vapor deposition of a source material onto an object, the steps of applying a coating of perfluoropolyether onto a surface which is positioned adjacent the object, forming the source material into a vapor stream in a vacuum which surrounds the object, and reflecting portions of the vapor stream from the surface toward the object for deposit thereon.

42. A process as in claim 41 in which the surface comprises at least a portion of the inner surface of the wall of a vacuum chamber or bell jar which is disposed about the object.

43. A process as in claim 41 in which the object includes surface portions not directly exposed on a line of sight with the source, and reflected portions of the vapor stream are deposited on said surface portions of the object.

44. A process as in claim 43 in which the object includes at least one through hole, and reflected portions of the vapor stream are deposited on the surfaces of the through hole.

45. A process as in claim 44 in which the object comprises a substrate having electronic device means, a masking structure is disposed over the substrate exposing the through holes, and the reflected portions of the vapor stream are directed through the masking structure and deposited on the through holes to form conductive paths with the electronic device means.

46. A process as in claim 44 in which the object is formed of a material which is not readily wettable with solder, the source material comprises a metal which is bonded by vapor deposition onto the surfaces of the through hole, and thereafter solder is bonded onto the deposited metal to form an electrical conductive path along the through hole.

47. A process as in claim 41 in which the object comprises a semiconductor substrate having surface portions covered by at least one layer of a material, with the layer having edges which slope toward or are normal with the substrate, and the vapor stream is deposited over the layer and substrate with reflected portions of the vapor stream being deposited along the edges of the layer.

48. A process as in claim 41 in which the object comprises a biological specimen having irregular surfaces or voids for use in electron microscope examination, and the material is deposited on the specimen with reflected portions of the vapor stream being deposited on the irregular surfaces or voids whereby the surface topography of the specimen is preserved.

* * * * *